United States Patent
Honma

(10) Patent No.: US 8,363,479 B2
(45) Date of Patent: Jan. 29, 2013

(54) NONVOLATILE SEMICONDUCTOR MEMORY DEVICE

(75) Inventor: Mitsuaki Honma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 13/039,756

(22) Filed: Mar. 3, 2011

(65) Prior Publication Data

US 2011/0299334 A1 Dec. 8, 2011

(30) Foreign Application Priority Data

Jun. 7, 2010 (JP) ................................. 2010-130347

(51) Int. Cl.
*G11C 16/06* (2006.01)
*G11C 16/04* (2006.01)

(52) U.S. Cl. .......... 365/185.22; 365/185.19; 365/185.28

(58) Field of Classification Search .............. 365/185.22
See application file for complete search history.

(56) References Cited

U.S. PATENT DOCUMENTS

| | | | |
|---|---|---|---|
| 6,594,178 B2 | 7/2003 | Choi et al. | |
| 7,233,529 B2 * | 6/2007 | Matsubara et al. | 365/185.3 |
| 7,307,887 B2 * | 12/2007 | Chen | 365/185.22 |
| 7,855,915 B2 * | 12/2010 | Honma et al. | 365/185.03 |
| 7,889,566 B2 * | 2/2011 | Kang | 365/185.22 |
| 7,940,579 B2 * | 5/2011 | Fujiu | 365/189.09 |
| 8,036,044 B2 * | 10/2011 | Dong et al. | 365/185.29 |
| 8,081,519 B2 * | 12/2011 | Lee et al. | 365/185.29 |
| 8,116,137 B2 * | 2/2012 | Goda et al. | 365/185.17 |
| 8,223,555 B2 * | 7/2012 | Kim et al. | 365/185.22 |
| 2002/0154545 A1 * | 10/2002 | Tanaka et al. | 365/185.22 |
| 2007/0183210 A1 * | 8/2007 | Choi et al. | 365/185.22 |

FOREIGN PATENT DOCUMENTS

JP 8-102198 4/1996

* cited by examiner

*Primary Examiner* — Son Mai

(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array connected to word lines and bit lines, and formed by arranging a plurality of memory cells in a matrix, each memory cell storing one of n values (n is a natural number of not less than 2), and a control circuit configured to write data in the memory cells by controlling potentials of the word lines and the bit lines in accordance with input data. The control circuit performs a write verify operation a plurality of number of times by changing a voltage level, stores data of the voltage level at which verify pass occurs, and determines a write voltage based on the stored data of the voltage level.

5 Claims, 12 Drawing Sheets

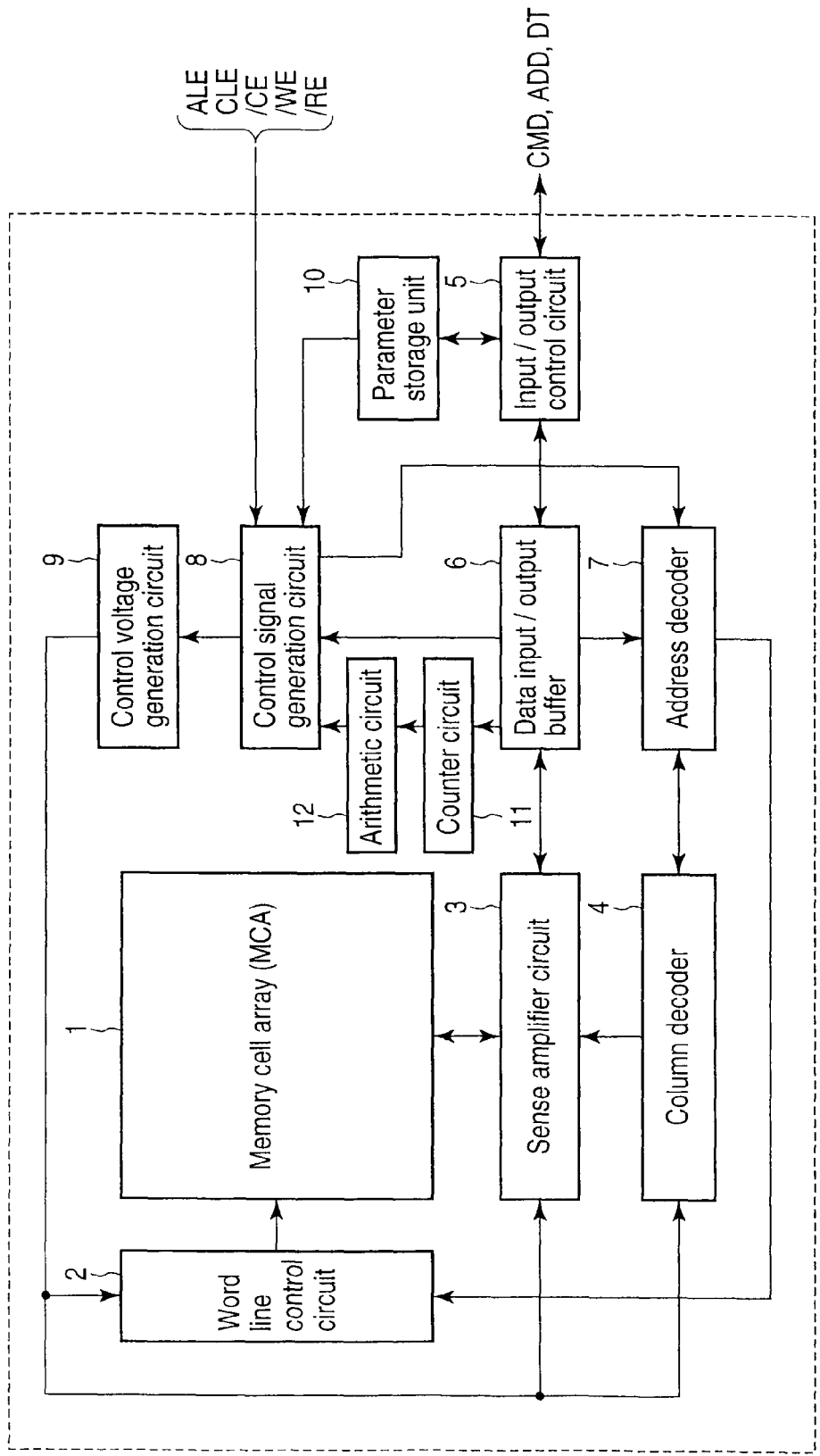
F I G. 1

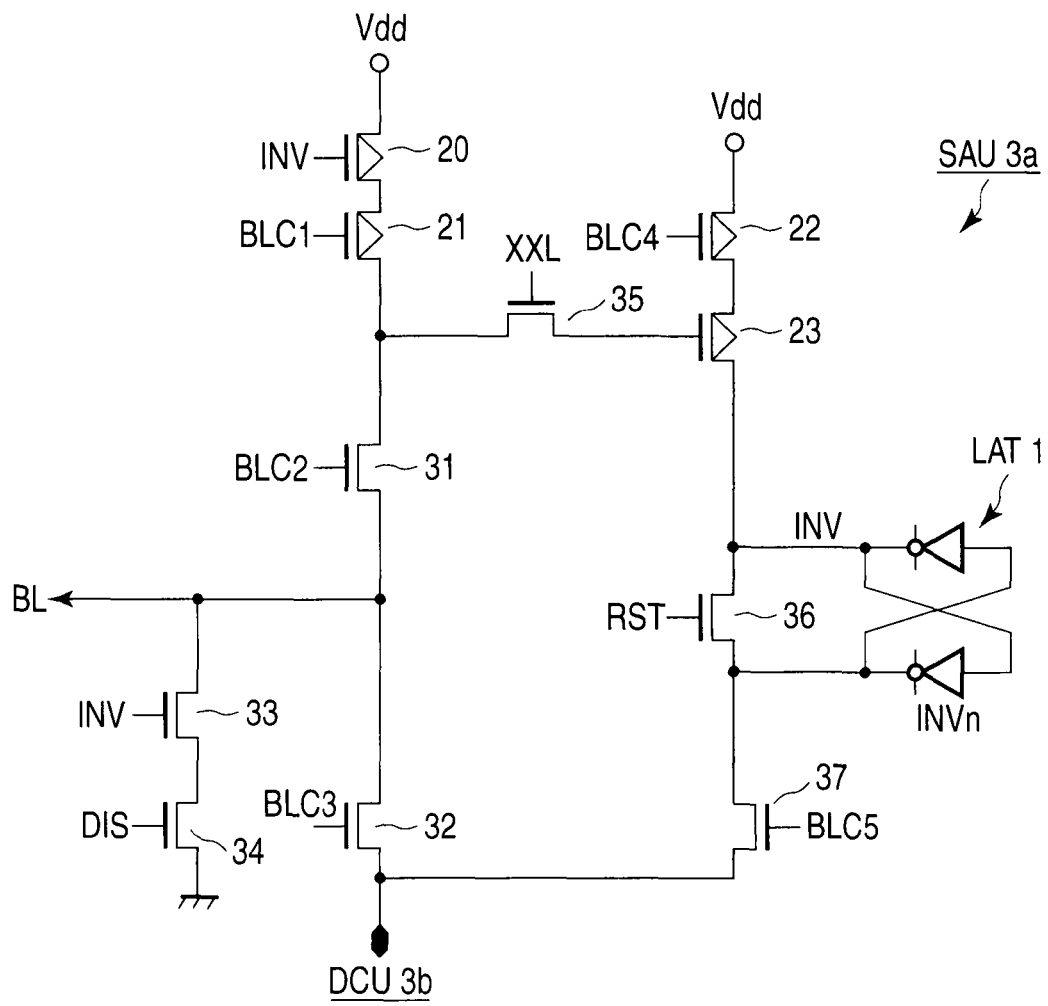
F I G. 3

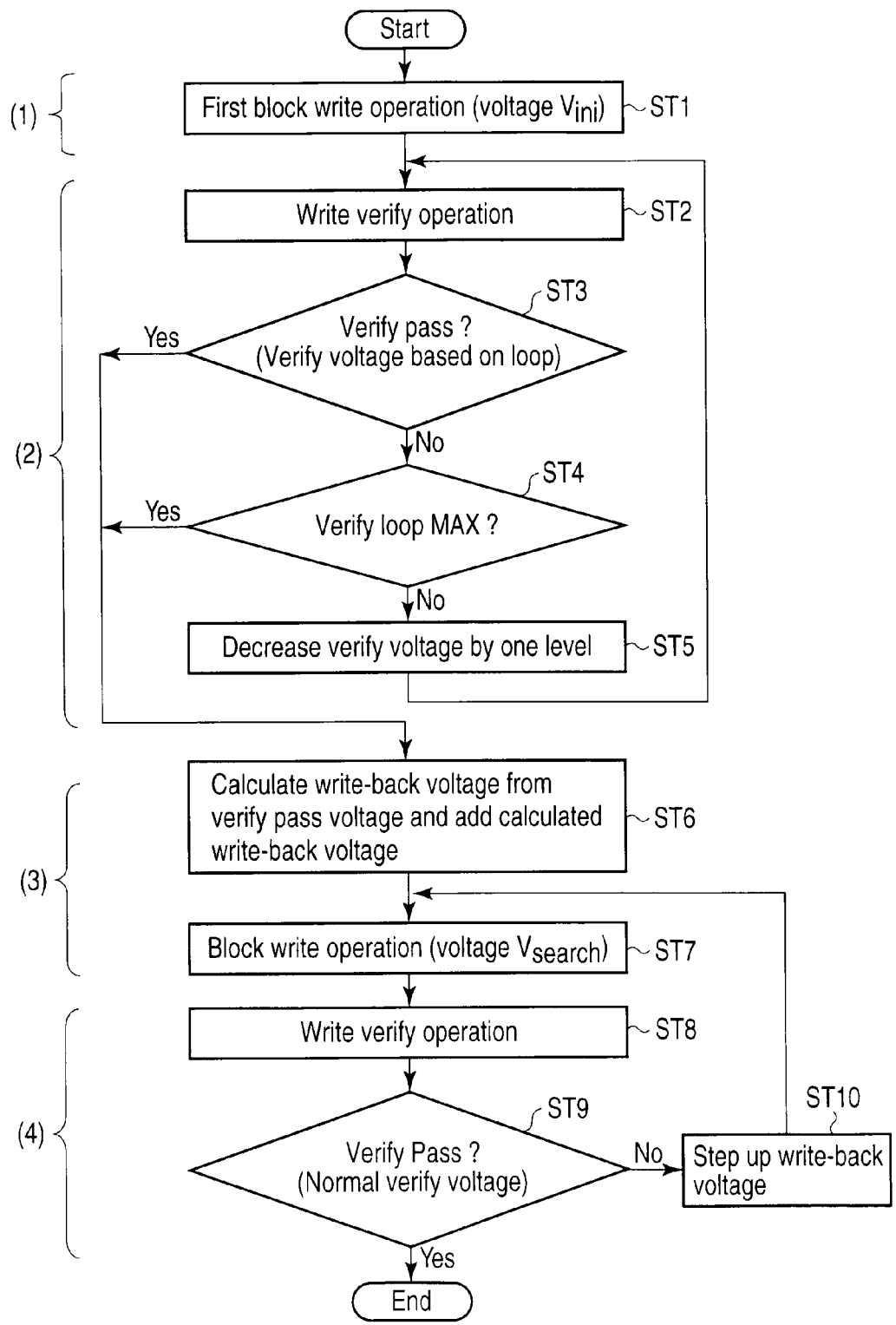
F I G. 5

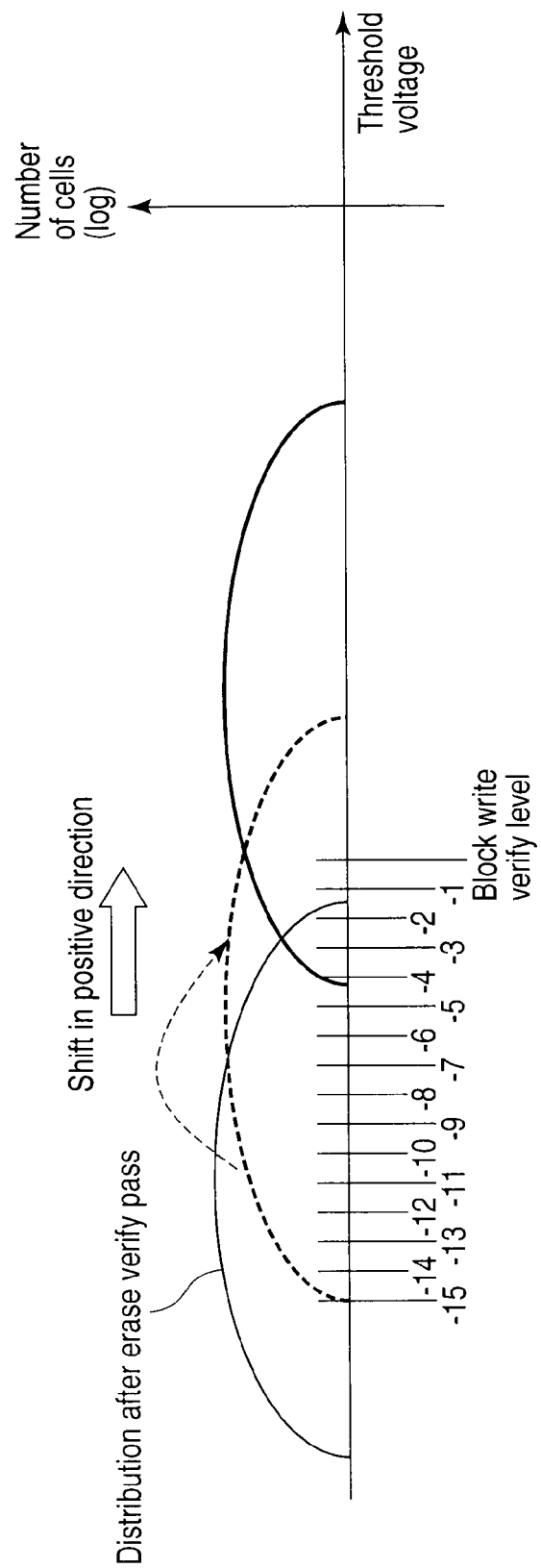
F I G. 6

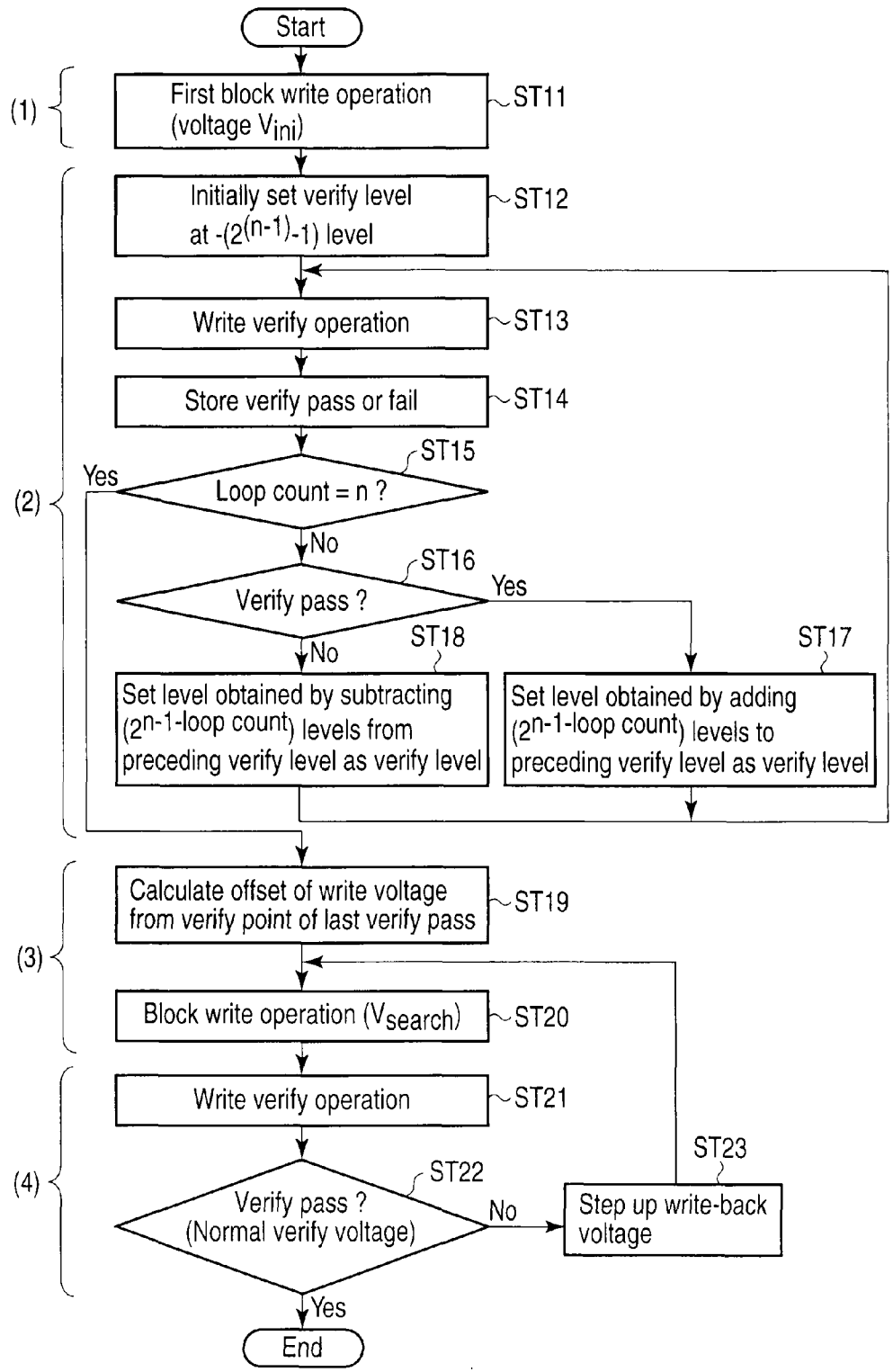
F I G. 8

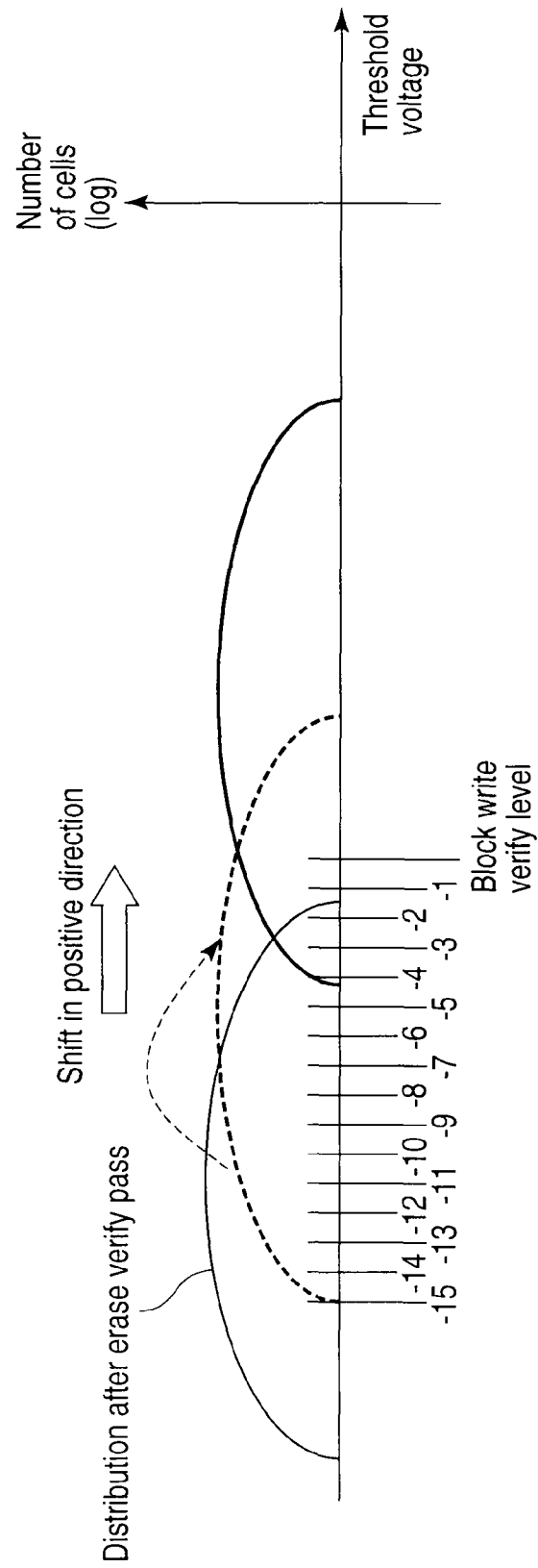
F I G. 9

Search for verify level

| Verify Status | -15 | -14 | -13 | -12 | -11 | -10 | -9 | -8 | -7 | -6 | -5 | -4 | -3 | -2 | -1 | 0 |
|---|---|---|---|---|---|---|---|---|---|---|---|---|---|---|---|---|
| loop 1 Fail | | | | | -11 | -10 | -9 | -8 | | | | | | | | |
| loop 2 Pass | | | | | -11 | -10 | -9 | -8 | | | | | | | | |
| loop 3 Fail | | | | | | -10 | -9 | -8 | | | | | | | | |
| loop 4 Pass | | | | | | -10 | | | | | | | | | | |

FIG. 11

NONVOLATILE SEMICONDUCTOR MEMORY DEVICE

CROSS-REFERENCE TO RELATED APPLICATIONS

This application is based upon and claims the benefit of priority from Japanese Patent Application No. 2010-130347, filed Jun. 7, 2010; the entire contents of which are incorporated herein by reference.

FIELD

Embodiments described herein relate generally to a nonvolatile semiconductor memory device that performs a write verify operation.

BACKGROUND

A NAND flash memory is known as a nonvolatile semiconductor memory device.

In the NAND flash memory, data are simultaneously erased for each block as a set of memory cells. When erasing a block of this NAND flash memory, the threshold value moves to a deep negative value because of over-erase. If the threshold voltage of a memory cell thus deepens, the write time prolongs when data is written in this block next time. Therefore, the overall threshold value is raised by performing a simultaneous write-back operation for each block after the block is erased. Recently, however, the time of this write-back operation increases the erase time.

Also, in the NAND flash memory, a program verify operation of verifying the threshold voltage of a memory cell is performed after a write operation. It is desirable to shorten the write time of this write operation as well.

BRIEF DESCRIPTION OF THE DRAWINGS

FIG. 1 is a schematic block diagram showing a nonvolatile semiconductor memory device according to an embodiment;

FIG. 3 is a circuit diagram showing an example of a sense amplifier unit according to the embodiment;

FIG. 5 is a flowchart showing a block write-back operation and its verify operation according to the first embodiment;

FIG. 6 is a graph showing an example of the threshold distribution of a memory cell written by the block write-back operation according to the first embodiment;

FIG. 8 is a flowchart showing a block write-back operation and its verify operation according to the second embodiment;

FIG. 9 is a graph showing an example of the threshold distribution of a memory cell written by the block write-back operation according to the second embodiment;

FIG. 11 is a view showing an example of binary search for a verify level according to the second embodiment.

DETAILED DESCRIPTION

Figure 2:
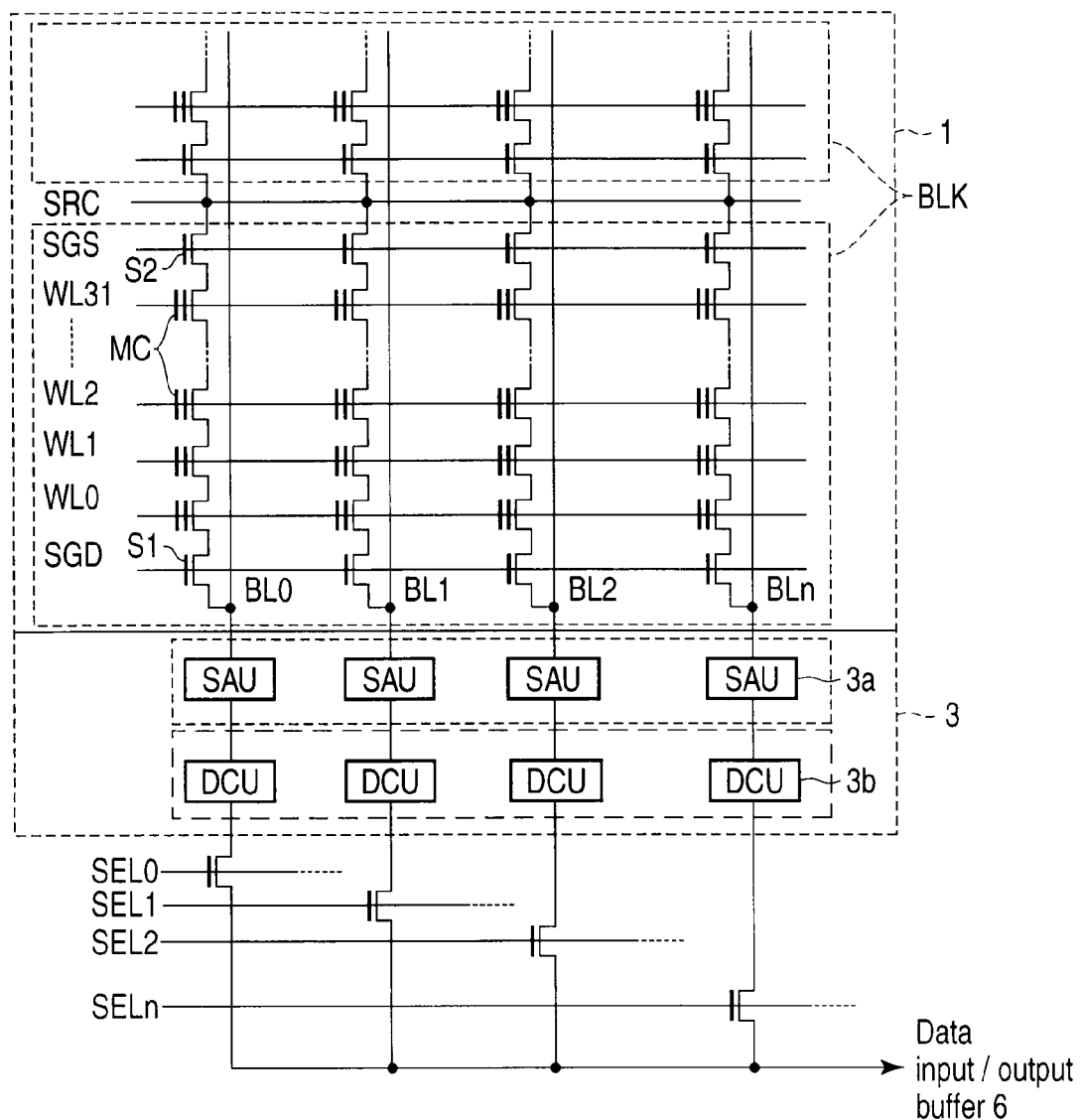
FIG. 2 is a circuit diagram showing examples of a memory cell array and sense amplifier circuit according to the embodiment.

In general, according to one embodiment, a nonvolatile semiconductor memory device includes a memory cell array connected to word lines and bit lines, and formed by arranging a plurality of memory cells in a matrix, each memory cell storing one of n values (n is a natural number of 2 or more), and a control circuit configured to write data in the memory cells by controlling potentials of the word lines and the bit lines in accordance with input data. The control circuit performs a write verify operation a plurality of number of times by changing the voltage level, stores data of a voltage level at which verify pass occurs, and determines a write voltage based on the stored data of the voltage level.

Embodiments will be explained below with reference to the accompanying drawing. In this explanation, the same reference numerals denote the same parts throughout the drawing.

FIG. 1 shows an outline of the arrangement of a nonvolatile semiconductor memory device according to an embodiment.

Referring to FIG. 1, a memory cell array (MCA) 1 is a NAND flash memory capable of storing, e.g., 2-bit data in one memory cell. That is, as will be described later, the memory cell array 1 includes a plurality of bit lines, a plurality of word lines, a common source line, and a plurality of electrically programmable memory cells, e.g., EEPROM cells arranged in the row and column directions. A word line control circuit 2 as a row decoder is connected to the word lines of the memory cell array 1, and selects and drives a word line. A sense amplifier circuit 3 is connected to the bit lines of the memory cell array 1, and has data read and write functions, and a function of converting write data into a number of times of remaining write, as will be described later. A column decoder 4 outputs a column selection signal for selecting a bit line of the memory cell array 1 in accordance with an output signal from an address decoder 7.

An input/output control circuit 5 receives various commands CMD, an address signal ADD, and write data DT, all of which are externally supplied. In data write, the input/output control circuit 5 supplies the write data DT to the sense amplifier circuit 3 via a data input/output buffer 6. In data read, data read to the sense amplifier circuit 3 is supplied to the input/output control circuit 5 via the data input/output buffer 6, and output outside from the input/output control circuit 5.

The address signal ADD supplied from the input/output control circuit 5 to the data input/output buffer 6 is supplied to the address decoder 7. The address decoder 7 decodes the signal, and supplies the decoded signal to the word line control circuit 2 and column decoder 4.

Also, the command CMD supplied from the input/output control circuit 5 to the data input/output buffer 6 is supplied to a control signal generation circuit 8. External control signals such as a chip enable signal/CE, write enable signal/WE, read enable signal/RE, address latch enable signal ALE, and command latch enable signal CLE are externally supplied to the control signal generation circuit 8. Based on an external control signal and command supplied in accordance with an operation mode, the control signal generation circuit 8 generates a control signal for controlling data write and erase sequences, and a control signal for controlling data read. These control signals are supplied to a control voltage generation circuit 9 and the address decoder 7.

In accordance with the various control signals supplied from the control signal generation circuit 8, the control voltage generation circuit 9 generates voltages, such as a read voltage, write voltage, verify voltage, and erase voltage, required for various operations of the memory cell array 1, sense amplifier 3, and column decoder 4.

A parameter storage unit 10 is connected to the input/output control circuit 5 and control signal generation circuit 8, and stores parameters suitable for the chip quality determined in a test step.

A counter circuit 11 counts the number of times of verify in a verify operation, and stores the count. An arithmetic circuit 12 stores a voltage level at which verify pass occurs, and calculates a write voltage after verify based on this voltage level or the verify count described above. The functions of the counter circuit 11 and arithmetic circuit 12 will be explained in detail later in each embodiment.

FIG. 2 shows configuration examples of the memory cell array 1 and sense amplifier circuit 3.

Referring to FIG. 2, the memory cell array 1 includes a plurality of blocks BLK as indicated by the broken lines. Each of these blocks is an erase unit. A plurality of NAND cells are arranged in each block BLK. One NAND cell includes memory cells MC, e.g., 32 EEPROMs connected in series, and selection gate transistors S1 and S2. The selection gate transistor S1 is connected to a bit line BL0. The selection gate transistor S2 is connected to a source line SRC. The control gates of the memory cells MC arranged in each row are connected together to a corresponding one of word lines WL0, WL1, and WL2 to WL31. The selection gate transistors S1 are connected together to a select line SGD. The selection gate transistors S2 are connected together to a select line SGS.

The sense amplifier circuit 3 includes a plurality of sense amplifier units (SAUs) 3a, and a plurality of data control units (DCUs) 3b. The sense amplifier circuits 3a are connected to bit line BL0 and bit lines BL1 and BL2 to BLn. The data control units 3b are connected in one-to-one correspondence to the sense amplifier units 3a. Each sense amplifier unit 3a senses and holds data read from a memory cell to a bit line. Each data control unit 3b is connected to the data input/output buffer 6 via a transistor that operates in accordance with a corresponding one of column selection signals SEL0 to SELn.

In a write operation (also called a programming operation), a read operation, and a program verify operation (also called a verify operation), a bit line connected to the sense amplifier unit 3a is selected, and one word line is selected. The write or read operation is performed at once by applying the write or read voltage to all memory cells connected to the selected word line.

The data control unit 3b holds externally supplied write data, and also holds data read from the sense amplifier unit 3a. Furthermore, in data write, the data control unit 3b performs an operation of converting write data in accordance with the data status.

Note that in FIG. 2, the sense amplifier units 3a are connected in one-to-one correspondence to the bit lines. However, the present embodiment is not limited to this, and each sense amplifier unit 3a may be formed for, e.g., two bit lines. Note also that the data control units 3b are connected in one-to-one correspondence to the sense amplifier units 3a, but the present embodiment is not limited to this. For example, it is also possible to form one data control unit 3b for eight sense amplifiers, and selectively connect the data control unit 3b to the sense amplifier units 3a.

FIG. 3 shows an example of the sense amplifier unit (SAU) 3a.

As shown in FIG. 3, the sense amplifier unit 3a includes a plurality of P-channel MOS transistors (to be referred to as PMOSs hereinafter) 20, 21, 22, and 23, a plurality of N-channel MOS transistors (to be referred to as NMOSs hereinafter) 31, 32, 33, 34, 35, 36, and 37, and a latch circuit LAT1 formed by, e.g., a clocked inverter circuit.

PMOS 20 has a source connected to a node to which a power supply Vdd is supplied, and a drain connected to the data control unit (DCU) 3b via PMOS 21 and NMOSs 31 and 32. The gate of PMOS 20 is connected to a node INV of latch circuit LAT1 (to be described later). A signal BLC1 is supplied to the gate of PMOS 21. Signals BLC2 and BLC3 are respectively supplied to the gates of NMOSs 31 and 32. The connection node of NMOSs 31 and 32 is connected to a bit line BL, and grounded via NMOSs 33 and 34. The gate of NMOS 33 is connected to node INV of latch circuit LAT1. NMOS 33 is controlled by data held in latch circuit LAT1. Furthermore, a signal DIS is supplied to the gate of NMOS 34.

PMOS 22 has a source connected to a node to which the power supply Vdd is supplied, and a drain connected to the data control unit 3b via PMOS 23 and NMOSs 36 and 37. A signal BLC4 is supplied to the gate of PMOS 22. The gate of PMOS 23 is connected to the connection node of PMOS 21 and NMOS 31 via NMOS 35. A signal XXL is supplied to the gate of NMOS 35. A reset signal RST is supplied to the gate of NMOS 36. A signal BLC5 is supplied to the gate of NMOS 37. Latch circuit LAT1 is connected in parallel with NMOS 36.

Figure 4:
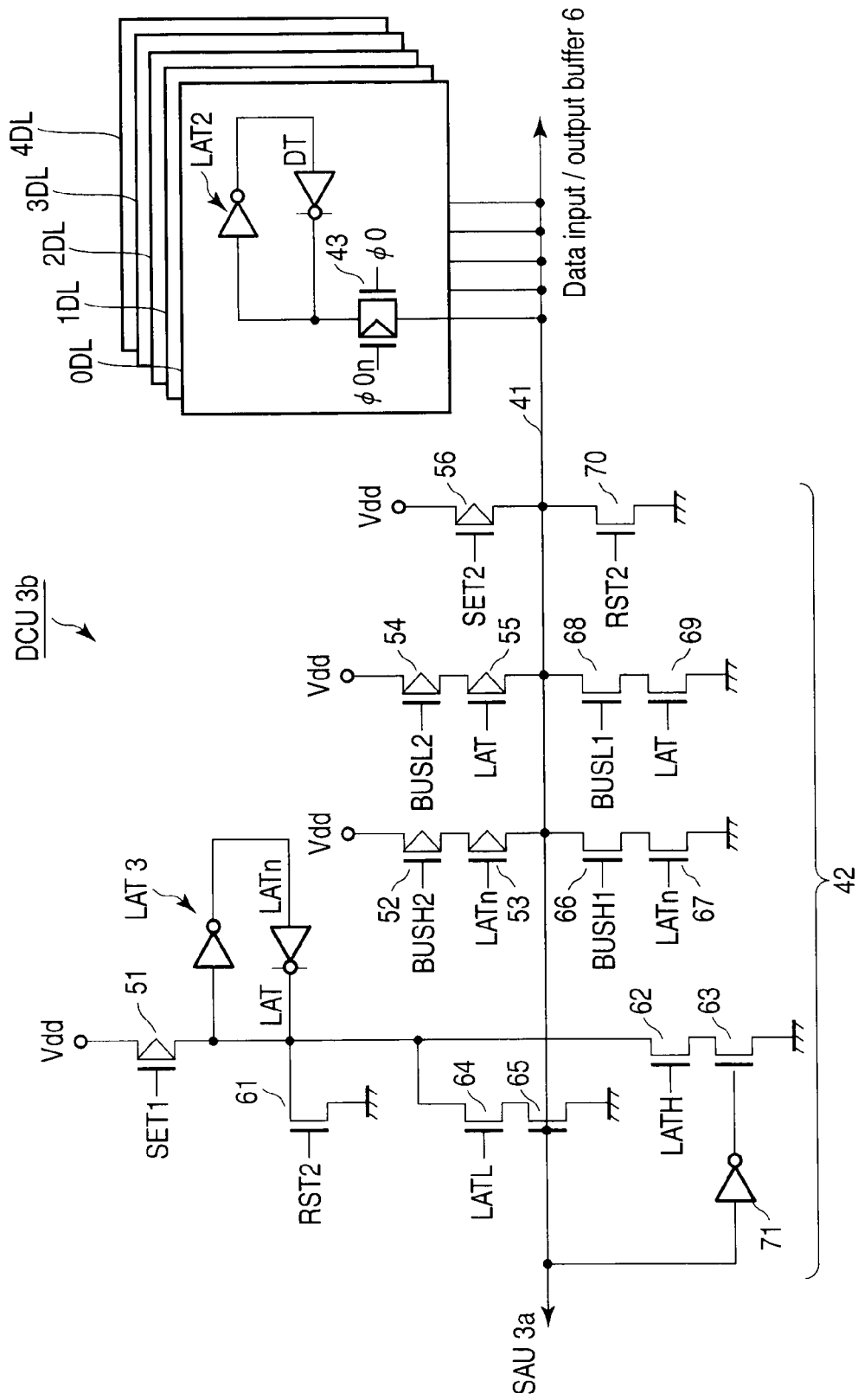
FIG. 4 is a circuit diagram showing an example of a data control unit according to the embodiment.

FIG. 4 shows an example of the data control unit (DCU) 3b.

As shown in FIG. 4, the data control unit 3b includes five data latch circuits 0DL, 1DL, 2DL, 3DL, and 4DL, a bus 41, and a data formation circuit 42.

The bus 41 has one end portion connected to the sense amplifier unit 3a, and the other end portion connected to the data input/output buffer 6.

Data latch circuit 0DL includes a latch circuit LAT2 and transfer gate 43. Latch circuit LAT2 is connected to the bus 41 via the transfer gate 43. The transfer gate 43 is controlled by a signal φ and its inverted signal φn. Data latch circuits 1DL, 2DL, 3DL, and 4DL have the same arrangement as that of data latch circuit 0DL, but receive different signals supplied to their transfer gates. Accordingly, data latch circuits 0DL, 1DL, 2DL, 3DL, and 4DL are selectively connectable to the bus 41.

The data formation circuit 42 includes a latch circuit LAT3, PMOSs 51 to 56, NMOSs 61 to 70, and an inverter circuit 71. The source of PMOS 51 is connected to a node to which the power supply Vdd is supplied. PMOS 51 has a gate to which a set signal SET1 is supplied, and a drain connected to latch circuit LAT3. The drain of PMOS 51 is grounded via NMOS 61, and also grounded via NMOSs 62 and 63. A reset signal RST2 is supplied to the gate of NMOS 61. A signal LATH is supplied to the gate of NMOS 62. The gate of NMOS 63 is connected to the output terminal of the inverter circuit 71 having an input terminal connected to the bus 41. Furthermore, the drain of PMOS 51 is grounded via NMOSs 64 and 65. A signal LATL is supplied to the gate of NMOS 64. The gate of NMOS 65 is connected to the bus 41.

The series circuit of PMOSs 52 and 53, the series circuit of PMOSs 54 and 55, and PMOS 56 are connected between the bus 41 and a node to which the power supply Vdd is supplied.

A signal BUSH2 is supplied to the gate of PMOS 52. The gate of PMOS 53 is connected to a node LATn of latch circuit LAT3. PMOSs 52 and 53 form a charging circuit for making the bus 41 high (H level) in accordance with signal BUSH2 and the potential at node LATn of latch circuit LAT3.

A signal BUSL2 is supplied to the gate of PMOS 54. The gate of PMOS 55 is connected to a node LAT of latch circuit LAT3. PMOSs 54 and 55 form a charging circuit for making the bus 41 high in accordance with signal BUSL2 and the potential at node LAT of latch circuit LAT3.

A set signal SET2 is supplied to the gate of PMOS 56. PMOS 56 is a charging circuit for making the bus 41 high in accordance with set signal SET2.

The series circuit of NMOSs 66 and 67, the series circuit of NMOSs 68 and 69, and NMOS 70 are connected between the bus 41 and the ground.

A signal BUSH1 is supplied to the gate of NMOS 66. The gate of NMOS 67 is connected to node LATn of latch circuit LAT3. NMOSs 66 and 67 form a discharging circuit for making the bus 41 low (L level) in accordance with signal BUSH1 and the potential at node LATn of latch circuit LAT3.

A signal BUSL1 is supplied to the gate of NMOS 68. The gate of NMOS 69 is connected to node LAT of latch circuit LAT3. NMOSs 68 and 69 form a discharging circuit for making the bus 41 low in accordance with signal BUSL1 and the potential at node LAT of latch circuit LAT3.

The reset signal RST2 is supplied to the gate of NMOS 70. NMOS 70 is a discharging circuit for making the bus 41 low in accordance with the reset signal RST2.

The data control unit 3b can hold data in data latch circuits 0DL, 1DL, 2DL, 3DL, and 4DL, and can also process the held data. That is, the data control unit 3b can, e.g., AND, NAND, OR, and invert the held data, as will be described later.

An outline of the operation of the above-described sense amplifier unit (SAU) 3a will be explained below.

(Write Operation)

When writing data in a memory cell, latch circuit LAT1 is initially reset by making the reset signal RST high (H level). That is, node INV of latch circuit LAT1 is made low (L level). After that, signals BLC1, BLC4, and DIS are made low.

Then, data is loaded from the data control unit 3b by making signals BLC2, BLC3, and XXL high, and signal BLC4 low. If this data is low ("0") indicating write, the gate of PMOS 23 goes low to turn on PMOS 23. Accordingly, a high ("1") is set in latch circuit LAT1. If the data is high ("1") indicating no write, PMOS 23 is turned off. Therefore, a low ("0") is set in latch circuit LAT1. That is, node INV of latch circuit LAT1 is made high when writing data, and low when writing no data.

Subsequently, the bit line BL is made high by making signals BLC1, BLC3, DIS, and XXL low, and signal BLC2 high. After that, signal DIS is made high. If node INV of latch circuit LAT1 is high indicating write, NMOS 33 is turned on to discharge the bit line via NMOSs 33 and 34. If node INV of latch circuit LAT1 is low indicating no write, NMOS 33 is turned off to keep the potential of the bit line high. When the select line SGD of the selection gate transistor S1 for connecting the bit line and NAND cell shown in FIG. 2 is made high after that, the bit-line potential is transferred to the channel of the memory cell. Simultaneously, a write voltage Vpgm is applied to the word line of the selected memory cell. Therefore, data is written in a write cell because the channel is made low (Vss) and the word line is set at the write voltage Vpgm. On the other hand, no data is written in a non-write cell because the channel is made high (Vdd-Vth: Vth is the threshold voltage of the selection gate transistor) and the word line is set at Vpgm.

(Read Operation)

When reading data from a memory cell, latch circuit LAT1 is initially reset by making the reset signal RST high. Then, the bit line is made high by making signals BLC1, BLC3, DIS, and XXL low, and signal BLC2 high. After that, a read level is supplied to a selected word line by making signal BLC2 low. If the threshold voltage of the memory cell is higher than the read level, the memory cell is off, so the bit line is kept high. If the threshold voltage of the memory cell is lower than the read level, the memory cell is turned on to discharge the bit line. Accordingly, the bit line goes low. Subsequently, signal BLC3 is made high to read the bit-line potential to the data control unit 3b.

(Program Verify Operation)

A program verify operation of verifying the threshold voltage of a memory cell after the write operation is almost the same as the read operation. In the program verify operation, a predetermined verify voltage is applied to the selected word line after charging the bit line to make it high. If the threshold voltage of the memory cell has reached the verify voltage, the memory cell is turned off. Therefore, the bit line potential is kept high. If the threshold voltage of the memory cell has not reached the verify voltage, the memory cell is turned on. Accordingly, the bit line potential goes low.

In this state, latch circuit LAT1 holds the potential of the bit line BL by making signals BLC1, BLC2, and XXL high, and signals BLC4, BLC3, DIS, and RST low. That is, if the threshold voltage of the memory cell has reached the verify voltage and the potential of the bit line BL is high, PMOS 23 is turned off. Therefore, latch circuit LAT1 holds a low. If the threshold voltage of the memory cell has not reached the verify voltage and the potential of the bit line BL is low, PMOS 23 is turned on. Accordingly, latch circuit LAT1 holds a high. That is, the potential of node INV of latch circuit LAT1 goes low if verify passes, and goes high if verify does not pass.

Furthermore, data of the inverting node INVn of latch circuit LAT1 is transferred to the data control unit 3b when NMOS 37 is turned on by making signal BLC5 high.

(Erase Operation)

Erasing data from a memory cell of a NAND flash memory or the like is to extract electrons stored in the floating gate of the memory cell toward a substrate by applying a high voltage to the substrate.

The potential states in this erase operation of, e.g., a NAND flash memory are that all word lines of a selected block are set in a low-voltage state at about 0 V, and all word lines of an unselected block are floated in order to prevent an erase error. Then, the potential difference between the substrate and the gate of the memory cell of the selected block is increased by applying a high voltage called VERA to the substrate, thereby extracting electrons from the floating gate toward the substrate.

(Erase Verify Operation)

After the erase operation, an erase verify operation of verifying the threshold voltage of the memory cell is performed. In this operation, the voltage of the selected word line is initially biased to a low voltage of about zero. In this state, each memory cell can pass its own threshold voltage. A sufficiently erased memory cell can sufficiently pass the voltage, but an insufficiently erased memory cell cannot sufficiently pass a high voltage. When charging is performed from the source line side toward the bit line, therefore, the charging level of the bit line is determined by the threshold voltage of a memory cell having a highest threshold voltage among memory cells connected to the bit line. Whether data is sufficiently erased is determined by sensing the biased state of the bit line by the sense amplifier.

That is, it is determined that erase verify has passed if the charging level of the bit line is high, and that erase verify has failed if the charging level of the bit line is low.

(Block Write-Back Operation after Erase)

If erase deepens too much (the threshold voltage of the memory cell excessively shifts in the negative direction) after erase verify has passed, an adverse effect such as the decrease in write operation speed occurs. To prevent this, block write-back is performed after erase verify has passed. This block write is also called soft programming, and shifts the threshold voltage of an erased memory cell in the positive direction by programming the memory cell.

In contrast with the erase operation, block write-back biases the substrate to a low voltage such as 0 V, and biases all word lines of a selected block to a high voltage such as 10 V. By this potential difference, electrons extracted to the substrate are slightly extracted from the substrate toward the floating gate of the memory cell. In an erased memory cell, this operation writes back a deep negative threshold voltage to some extent in the positive direction.

(Block Write-Back Verify Operation)

After block write-back is performed, a block write verify operation is performed to check whether the write-back is sufficient. The operation principle is the same as that of erase verify, but the pass conditions are opposite.

That is, if the write-back is sufficient (if it is determined that the write-back of most NAND strings is sufficient), the threshold value of a memory cell has increased in the positive direction, so the memory cell is hard to turn on. Accordingly, the level of charging to the bit line does not rise very much even when charging is performed from the source line side. In contrast with block erase verify, therefore, the state in which the level of charging to the bit line is low is regarded as "pass".

On the other hand, if the write-back is insufficient, the threshold value of a memory cell has not increased very much in the positive direction, so the level of charging to the bit line rises. In contrast with block erase verify, therefore, the state in which the level of charging to the bit line is high is regarded as "fail".

In the procedure of "erase operation→erase verify operation→block write-back operation→block write-back verify operation" described above, a portion that recently poses the problem of a long processing time is the loop of "block write-back operation→block write-back verify operation".

The initial voltage of the block write-back operation must be decreased because the threshold value readily fluctuates because of the deterioration of a memory cell (the deterioration caused by the repetition of erase and write). However, this increases the number of times of the loop before the pass condition of block write-back verify is met.

Accordingly, each embodiment to be described below proposes a method of calculating an optimum write voltage by predicting a threshold value based on an erase distribution.

First Embodiment

Figure 7:
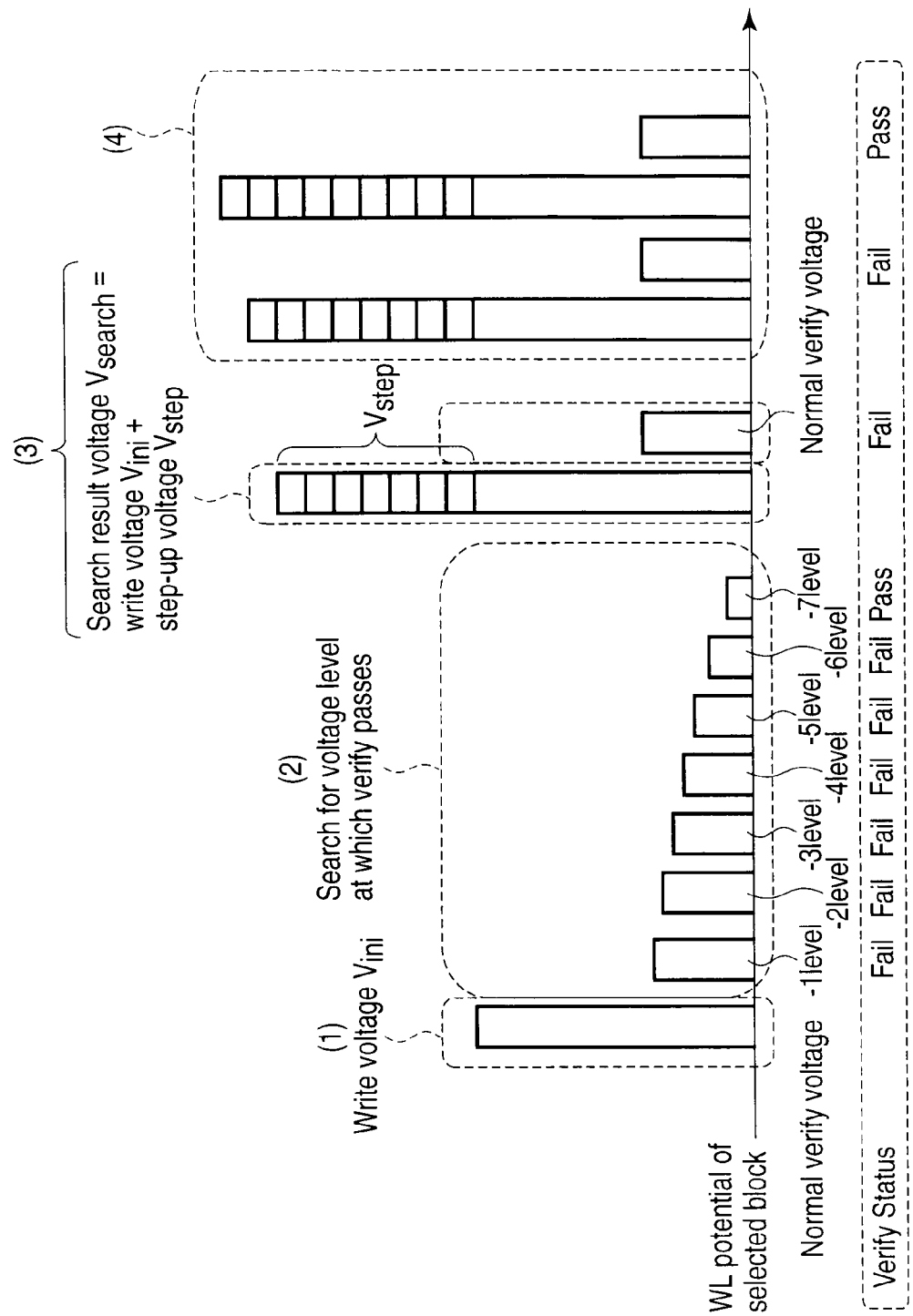
FIG. 7 is a graph showing an example of the application voltage of a word line in the block write-back operation and its verify operation according to the first embodiment.

FIG. 5 is a flowchart showing a block write-back operation and its verify operation according to the first embodiment. FIG. 6 shows an example of the threshold distribution of a memory cell written by the block write-back operation according to the first embodiment. FIG. 7 shows an example of the word line application voltage in the block write-back operation and its verify operation according to the first embodiment. The procedures of the block write-back operation and its verify operation after erase verify pass according to the first embodiment will be explained below.

First, a block write operation is performed (ST1 in FIG. 5, (1) in FIG. 7). That is, a low write voltage $V_{ini}$ is applied to the word line of a selected block, thereby moving the threshold distribution in the positive direction from the state of the threshold value when erase verify has passed, as shown in FIG. 6. As described previously, the write voltage $V_{ini}$ is desirably decreased because, e.g., the threshold value readily fluctuates because of the deterioration of a memory cell caused by the repetition of erase and write. The write voltage $V_{ini}$ is preferably less than or equal to a conventionally used voltage value. Note that this block write operation (ST1 in FIG. 5) may also be omitted.

Then, the selected word line is biased to several verification voltages, and the level of a word-line voltage at which successful verification occurs is specified (ST2 to ST5 in FIG. 5, (2) in FIG. 7). That is, a voltage value lower by one level than a normal verification voltage is initially applied to the selected word line (ST2 in FIG. 5), and whether successful verification occurs is determined (ST3 in FIG. 5). If no successful verification occurs, the verification voltage is decreased by one level (ST5 in FIG. 5) to apply a voltage value lower by two levels than the normal verification voltage to the selected word line (ST2 in FIG. 5), and whether successful verification occurs is determined again (ST3 in FIG. 5). If the level of a word-line voltage at which successful verification occurs is specified by repeating this loop, a write-back voltage $V_{search}$ is calculated from the successful verification voltage, and block write is performed (ST6 and ST7 in FIG. 5, (3) in FIG. 7).

The procedure in ST2 to ST7 described above will be explained below by taking a practical example. Assume that verify pass occurs when the voltage value is lower by seven levels than the normal verify voltage. First, the voltage value is monotonically decreased by one level at a time from the normal verify voltage, and a voltage level at which verify pass occurs is searched for. Consequently, verify pass occurs when the voltage value is lower by seven levels than the normal verify voltage. Therefore, block write is performed by the voltage value $V_{search}$ obtained by adding a voltage $V_{step}$ stepped up by seven levels, to the initial write voltage $V_{ini}$.

In this embodiment, the voltage level during verify pass search is monotonically decreased by a predetermined level at a time. However, the this embodiment not limited to this, and it is also possible to monotonically increase the voltage level by a predetermined level at a time. This is so because when the voltage change is thus constant, the voltage value $V_{search}$ to be used in ST7 can be calculated by adding a predetermined value based on the number of times of verify or verify pass voltage found by search, and this facilitates calculating the voltage value $V_{search}$.

Note that in the procedure in ST2 to ST5 described above, whether the verify loop of a predetermined verify voltage is maximum is also determined after ST3 (ST4 in FIG. 5). That is, when the voltage is set to be zero when it is lower by, e.g., ten levels than the normal verify voltage on the search level at which verify pass occurs, if no verify pass occurs even when a voltage value lower by nine levels than the normal verify voltage is applied, the verify loop becomes maximum when the verify operation is performed again, so the process continues to ST6. In this case, the voltage value $V_{search}$ to be used in block write in ST7 is obtained by adding, to the initial write voltage $V_{ini}$, the voltage corresponding to the number of levels until the loop becomes maximum (in the above example, the voltage corresponding to nine levels).

Then, after ST7, the block write operation and verify operation are performed at the normal verify voltage until verify pass occurs (ST7 to ST10 in FIG. 5, (4) in FIG. 7). That is, the block write operation and verify operation are repeated by stepping up the write-back voltage by one level at a time from the voltage value $V_{search}$ as the search result until verify pass occurs (ST10 in FIG. 5). If verify pass occurs, write-back verify is terminated.

Note that the counter circuit 11 shown in FIG. 1 counts and stores the number of times of verify necessary for the voltage $V_{step}$ to be added to the initial voltage $V_{ini}$ in ST6. Note also that the arithmetic circuit 12 stores the voltage level at which verify pass has occurred, and calculates the voltage value $V_{search}$ to be used in the write operation in ST7.

In the first embodiment described above, the block write-back verify operation is performed a plurality of number of times by constantly changing the voltage level, the arithmetic circuit 12 stores the voltage level at which verify pass occurs, and the counter circuit 11 counts and stores the number of times of verify. The write voltage value $V_{search}$ is determined based on one of the stored voltage level and count. Since this makes it possible to reduce the number of times of block write-back, the erase time can be shortened.

Assume that block write is performed by stepping up the write-back voltage by one level at a time as shown in ST10 of FIG. 5. In this case, verify is initially performed by adding a low-level write voltage. If write verify fails, a write voltage stepped up by one level is applied, and the write-back verify operation is performed in the same manner as before. Therefore, the time before verify pass occurs is very long because the write-back loop is repeated until verify pass occurs by increasing the step-up voltage by one level at a time.

By contrast, this embodiment first searches for a voltage level at which verify pass occurs, and then performs a write operation by using the search result. For example, when a voltage higher by seven levels than an initial value is necessary as a write-back voltage for allowing verify pass, a write operation and its verify operation must be repeated seven times each by stepping up the voltage by one level at a time, in the case as shown in ST10 of FIG. 5. In this embodiment, however, a write-back pass level can be found earlier than usual because a write-back operation is performed once after a verify operation is performed seven times. Since this embodiment can thus reduce the number of times of block write-back, the block write-back operation time in an erase operation can be shortened.

Second Embodiment

In the second embodiment, a voltage at which verify pass occurs is searched for by binary search as a method of further reducing the number of times of verify compared to the first embodiment. The binary search of this embodiment is a method of determining whether a target value is on the right or left side of the median value of verify voltage levels, while monitoring the median value, by changing the voltage level by using the result of verify pass/fail, and searching for the target value while confirming that the value does not exist on the other side.

Figure 10:
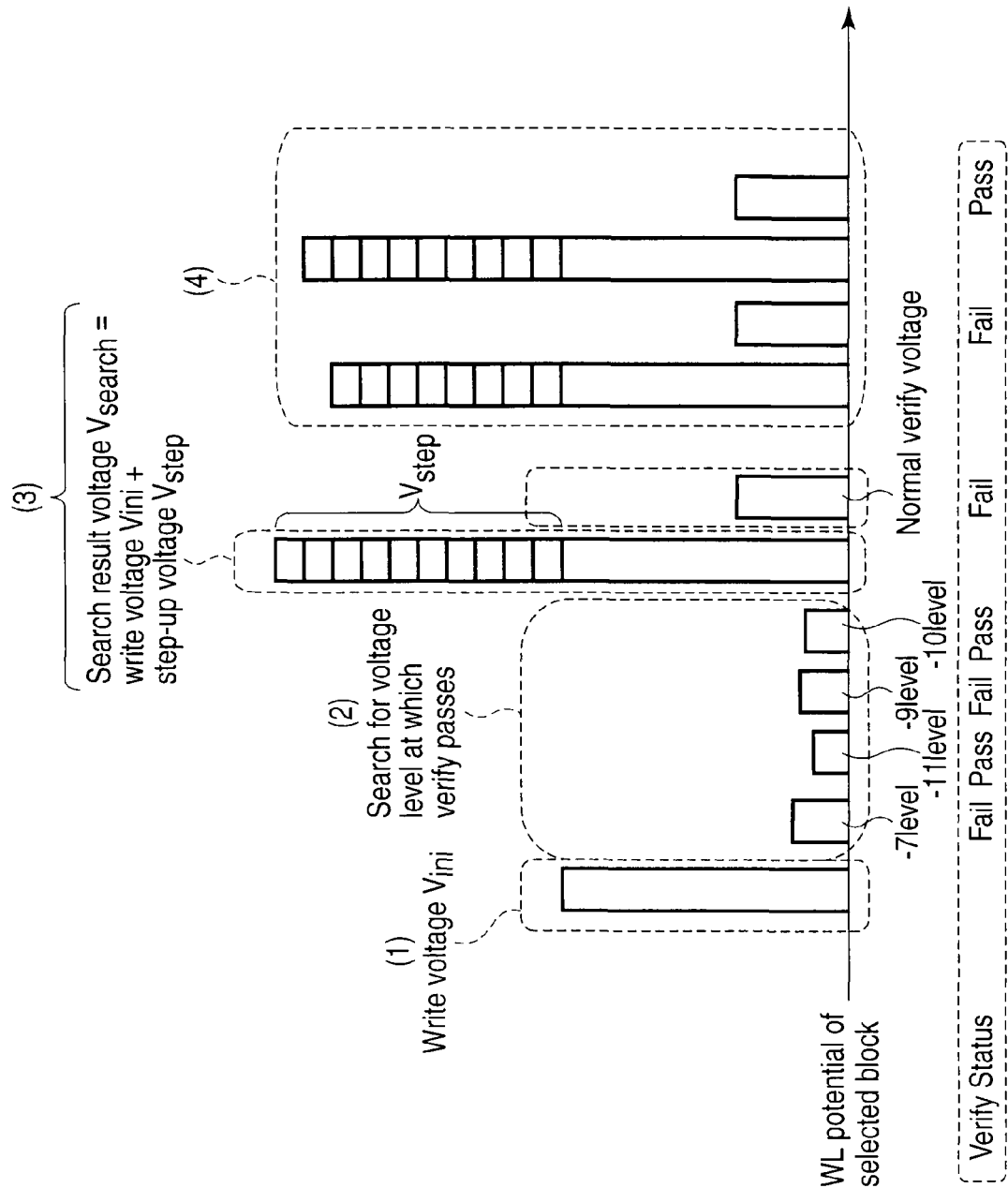
FIG. 10 is a graph showing an example of the application voltage of a word line in the block write-back operation and its verify operation according to the second embodiment.

FIG. 8 is a flowchart showing a block write-back operation and its verify operation according to the second embodiment. FIG. 9 shows an example of the threshold distribution of a memory cell written by the block write-back operation according to the second embodiment. FIG. 10 shows an example of the word line application voltage in the block write-back operation and its verify operation according to the second embodiment. FIG. 11 shows an example of binary search for a verify level according to the second embodiment. The procedures of the block write-back operation and its verify operation after erase verify pass according to the second embodiment will be explained below.

First, a block write operation is performed (ST11 in FIG. 8, (1) in FIG. 10). That is, a low write voltage $V_{ini}$ is applied to the word line of a selected block, thereby moving the threshold distribution in the positive direction from the state of the threshold value when erase verify has passed, as shown in FIG. 9. As in the first embodiment, the write voltage $V_{ini}$ desirably has a small voltage value, and is preferably less than or equal to a conventionally used voltage value. This initial block write operation (ST11 in FIG. 8) may also be omitted.

Then, $2^n$ (n is a natural number of 2 or more) write verify voltage values are set at equal intervals, and the selected word line is biased to the verify voltage by performing the binary search method n times, thereby specifying the level of a word line voltage at which verify pass occurs (ST12 to ST18 in FIG. 8, (2) in FIG. 10). Note that "n" of the $2^n$ voltage values set as described above is determined based on the step-up voltage.

More specifically, when performing binary search n times, the verify level is initially set at a $-(2^{(n-1)}-1)$ level (ST12 in FIG. 8). The write verify operation is performed by this $-(2^{(n-1)}-1)$ level (ST13 in FIG. 8), and the verify result indicating pass or fail is temporarily stored in, e.g., the counter circuit 11 shown in FIG. 1 (ST14 in FIG. 8).

Subsequently, whether the loop count has reached n is determined (ST15 in FIG. 8). If the loop count has not reached n, whether the verify result stored in ST14 is pass is determined (ST16 in FIG. 8). If the verify result is pass, a level obtained by adding ($2^{n-1-loop\ count}$) levels to the preceding verify level is set as the verify level (ST17 in FIG. 8). On the other hand, if the verify result is fail, a level obtained by subtracting ($2^{n-1-loop\ count}$) levels from the preceding verify level is set as the verify level (ST18 in FIG. 8). After that, the write verify operation is performed again by using the verify level set in ST17 or ST18 (ST13 in FIG. 8), and the loop is repeated.

If the loop count has reached n in ST15, the offset of the write voltage is calculated from a verify point at which the last verify pass has occurred (ST19 in FIG. 8), and block write is performed at a voltage value $V_{search}$ as the result of the calculation (ST20 in FIG. 8, (3) in FIG. 10).

The procedure of ST12 to ST18 described above will be explained below by using the practical example shown in FIG. 11. This example shown in FIG. 11 is a verify operation in which a level obtained by adding ten levels to an initial value is used as a target for a device having $2^4=16$ (binary search count n=4) voltage levels.

In this case, verify is initially performed by selecting a $-(2^{4-1}-1)=7$ level as the verify level. Since the result is verify fail, verify is then performed by selecting a $-7-2^{(4-1-1)}=-11$ level. Since the result is verify pass, verify is then performed by selecting a $-11+2^{(4-1-2)}=-9$ level.

Since the result is verify fail, verify is performed by selecting a $-9-2^{(4-1-3)}=-10$ level. If the result is verify pass, this means that the last loop has passed. Therefore, a $-10$ level is use as a target, and block write is performed by using the voltage value $V_{search}$ obtained by adding a voltage $V_{step}$ stepped up by ten levels to the initial write voltage $V_{ini}$.

Then, the block write operation and verify operation are performed at the normal verify voltage until verify pass occurs (ST20 to ST23 in FIG. 8, and (4) in FIG. 10). That is, the block write operation and verify operation are repeated by stepping up the write-back voltage by one level at a time until verify pass occurs (ST23 in FIG. 8). If verify pass occurs, write verify is terminated.

Note that the counter circuit 11 shown in FIG. 1 counts and stores the number of times of verify necessary for the voltage $V_{step}$ to be added to the initial voltage $V_{ini}$ in ST19. Note also that the arithmetic circuit 12 stores the voltage level at which verify pass has occurred, and calculates the voltage value $V_{search}$ to be used in the write operation in ST20.

In the above-mentioned second embodiment, the voltage level at which verify pass occurs can rapidly be found by using the binary search method, so the erase time can be shortened more than that of the first embodiment. For example, when a level lower by ten levels than the normal voltage level is the voltage level at which verify pass occurs, verify must be performed ten times in the first embodiment, but need only be performed four times in the second embodiment. This can further shorten the erase time.

Figure 12:
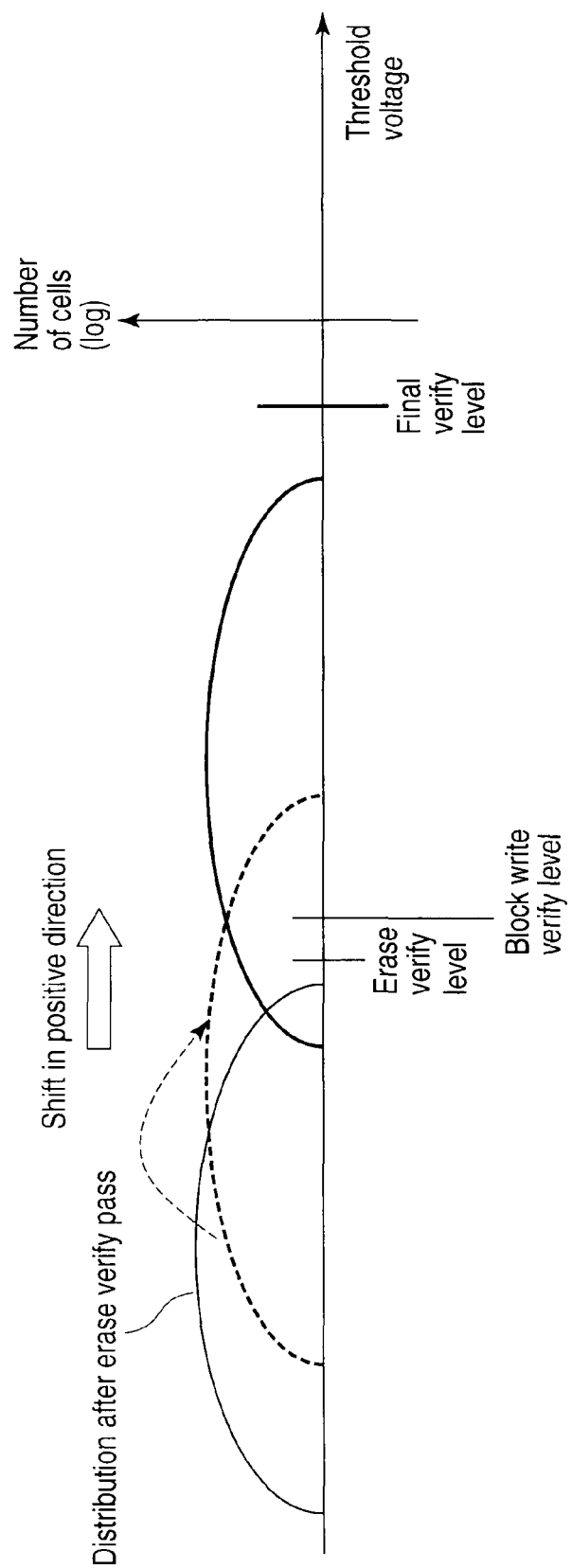
FIG. 12 is a graph showing the setting of a final verify level according to the embodiment.

Note that in each embodiment described above, it is also possible to set a final verify level, and check whether the threshold voltage is written back more than necessary by the write-back operation, as shown in FIG. 12.

That is, when an erase verify operation is performed to check whether a memory cell becomes "less than or equal to a specific threshold value" by an erase operation, the process advances to a write-back operation if this erase verify operation passes. The write-back operation is performed on memory cells connected to all word lines of a selected block. In a write-back verify operation, it is confirmed that write becomes "less than or equal to the specific threshold value". If this verify operation passes, it is determined that write-back has passed. Finally, to check whether write-back has raised the threshold value more than necessary, it is also possible to set a final verify level, and perform a final verify operation of confirming that the level is "less than or equal to the specific threshold value", as shown in FIG. 12.

If all the processes described above pass, the erase operation is complete. If final verify fails, the procedure returns to the beginning, and starts from the erase operation. When setting the next write-back voltage after this re-erase operation has passed, a long time is necessary if an optimum write-back voltage is determined by changing the verify level as explained in each embodiment. Therefore, it is also possible to store the result of search (e.g., the count) performed before the re-erase operation in each embodiment in, e.g., the counter circuit 11 shown in FIG. 1, and use the search result in the write-back operation of re-erase. This makes it possible to shorten the operation time.

Note that each embodiment described above has been explained by taking, as an example, the process of shortening the write operation time in the block write-back operation and its verify operation in data erase. However, the embodiment is not limited to this, and also applicable to a write operation and its verify operation. The write operation differs from the erase operation in that data is written in all word lines of a selected block in the erase operation, but data is written in one selected word line in the write operation.

The above-described embodiments each can provide a nonvolatile semiconductor memory device capable of shortening the write operation time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a memory cell array connected to word lines and bit lines, and formed by arranging a plurality of memory cells in a matrix, each memory cell storing one of n values (n is a natural number of not less than 2); and
   a control circuit configured to write data in the memory cells by controlling potentials of the word lines and the bit lines in accordance with input data,
   wherein the control circuit performs a write verify operation a plurality of number of times by changing a voltage level, stores data of the voltage level at which verify pass occurs, and determines a write voltage based on the stored data of the voltage level.

2. The device according to claim 1, wherein the verify operation is a write-back verify operation after erase.

3. The device according to claim 1, wherein
   the control circuit comprises a counter circuit configured to count the number of times of verify, and
   the voltage level in the verify operation changes by monotonically decreasing or increasing, and the write voltage determines based on one of the voltage level at which verify pass has occurred and a count of the number of times of verify.

4. The device according to claim 2, wherein if the write-back operation after erase fails and a next erase operation is performed, the control circuit determines the write voltage based on the stored data of the voltage level.

5. The device according to claim 1, wherein the control circuit sets $2^n$ (n is a natural number of not less than 2) voltage levels of the verify operation at equal intervals, and searches for the voltage level at which verify pass occurs by performing binary search n times.

* * * * *